United States Patent
Zhong et al.

(10) Patent No.: US 7,416,980 B2
(45) Date of Patent: Aug. 26, 2008

(54) FORMING A BARRIER LAYER IN INTERCONNECT JOINTS AND STRUCTURES FORMED THEREBY

(75) Inventors: Ting Zhong, Tigard, OR (US); Valery Dubin, Portland, OR (US); Ming Fang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 11/078,611

(22) Filed: Mar. 11, 2005

(65) Prior Publication Data

US 2006/0205234 A1    Sep. 14, 2006

(51) Int. Cl.
*H01L 21/44* (2006.01)

(52) U.S. Cl. .............. 438/685; 438/643; 438/648; 438/672; 257/E21.295; 257/E21.508

(58) Field of Classification Search .............. None
See application file for complete search history.

(56) References Cited

U.S. PATENT DOCUMENTS

| | | | |
|---|---|---|---|
| 6,297,146 B1 * | 10/2001 | Lopatin | 438/625 |
| 6,383,923 B1 * | 5/2002 | Brown et al. | 438/666 |
| 6,861,349 B1 * | 3/2005 | Lopatin et al. | 438/627 |
| 2006/0071340 A1 | 4/2006 | Dubin et al. | |

* cited by examiner

*Primary Examiner*—Scott B. Geyer
*Assistant Examiner*—Cheung Lee
(74) *Attorney, Agent, or Firm*—Kathy J. Ortiz; Intel Corporation

(57) ABSTRACT

Methods of forming a microelectronic structure are described. Embodiments of those methods include forming a barrier layer on a substrate, wherein the barrier layer comprises molybdenum; and forming a lead free interconnect structure on the barrier layer.

12 Claims, 5 Drawing Sheets

Forming a barrier layer on a substrate by utilizing an electroplating process, wherein the electroplating process comprises a metal source, a first complexing agent, a second complexing agent, a molybdenum source, a pH adjuster, a pH buffer and at least one additive selected from the group consisting of a stress reliever, a surfactant, and a stabilizer. ——210

Forming and/or attaching a lead free interconnect structure on the barrier layer. ——220

FORMING A BARRIER LAYER IN INTERCONNECT JOINTS AND STRUCTURES FORMED THEREBY

BACKGROUND OF THE INVENTION

As microelectronic technology advances for higher processor performance, microelectronic package sizes may shrink and higher input/output (I/O) counts may be required to reduce manufacturing costs. Packaging technologies, especially in some chipset applications, may drive a finer pitch between interconnect structures, such as between solder balls in a ball grid array package, for example. With the scaling of pitch, smaller ball size is expected which may pose a challenge to interconnect joint (i.e., the interface between an interconnect structure and another surface, such as a substrate or contact pad) performance.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
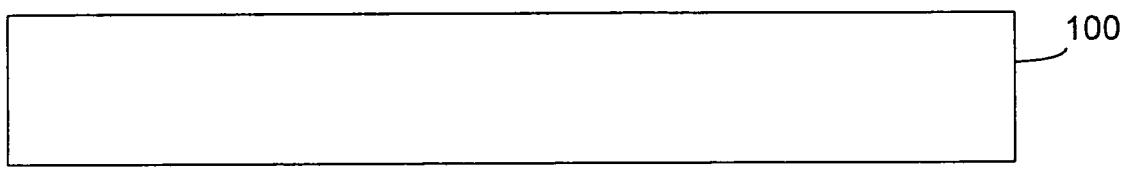
FIGS. 1a-1c represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a barrier layer, are described. Those methods may comprise forming a barrier layer on a substrate, wherein the barrier layer comprises molybdenum, and then forming a lead free solder structure on the barrier layer.

Figure 1B:
Figure 1C:
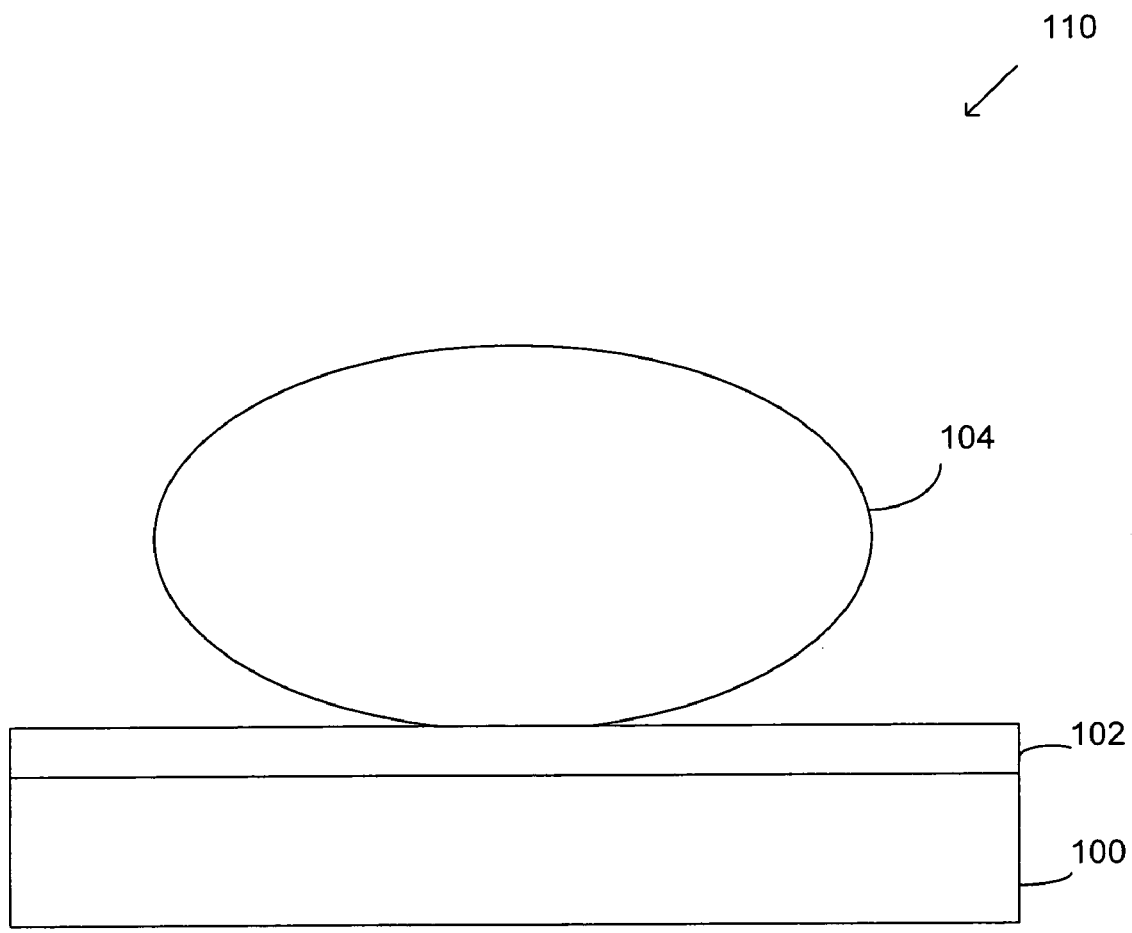

FIGS. 1a-1c illustrate an embodiment of a method of forming a microelectronic structure, such as a barrier layer, for example. FIG. 1a illustrates a substrate 100. The substrate 100 may comprise any surface that may be generated when making a microelectronic structure, upon which a barrier layer may be formed. In one embodiment, the substrate 100 may comprise a conductive material, such as but not limited to copper, for example. In one embodiment the substrate 100 may comprise a portion of a microelectronic package, such as a conductive layer on a package structure (not shown).

A barrier layer 102 may be formed on the substrate 100 (FIG. 1b). In one embodiment, the barrier layer 102 may be formed utilizing an electroplating process, as is well known in the art. In one embodiment, the electroplating process may comprise placing the substrate 100 in an aqueous solution comprising a metal source, a first complexing agent, a second complexing agent, a molybdenum source, a pH adjuster, a pH buffer and at least one additive selected from the group consisting of a stress reliever, a surfactant, and a stabilizer.

In one embodiment, the metal source may comprise at least one of iron, nickel and cobalt. In one embodiment, the metal source may comprise at least one of iron sulfate and iron chloride. In one embodiment, the metal source may comprise an anode, as is well known in the art. The anode may comprise a material selected from the group consisting of iron, cobalt, and nickel. In one embodiment, the electroplating process may comprise a cathode, that may comprising at least one of copper, bronze and brass, and combinations thereof. In one embodiment, the metal source may further comprise at least one of a chloride salt, a sulfate salt, a sulfamate salt, and an acetate salt. In one embodiment, the metal source may comprise a concentration of greater than about 10 grams per liter.

In one embodiment, the first complexing agent may comprise at least one of citric acid, citrate, pyrophosphate and acetate and combinations thereof, and may comprise a concentration of about 20 grams per liter or greater, in some embodiments. In one embodiment, the second complexing agent may comprise at least one of tartrate, glycolic acid, acetate, acetic acid, and ammonium chloride, and may comprise a concentration of between about 1 to about 100 grams per liter, in some embodiments. In one embodiment, the molybdenum source may comprise at least one of potassium molybdate, sodium molybdate and ammonium molybdate, and in some embodiments the concentration of the molybdenum source may comprise greater than about 0.1 grams per liter.

In one embodiment, the pH adjuster may comprise at least one of ammonium hydroxide, potassium hydroxide, sodium hydroxide, hydrochloric acid, and sulfuric acid, and the pH buffer may comprise boric acid. In one embodiment, the pH buffer may comprise a concentration greater than about 10 grams per liter, but will depend upon the particular application. In one embodiment, the electroplating process may further comprise at least one of an additive selected from the group consisting of a stress reliever, a surfactant, and a stabilizer. In one embodiment, the stress reliever may comprise polyethylene glycol (PEG), the surfactant may comprise sodium lauryl sulfate, and the stabilizer may comprise at least one of saccharin, a hydrazine and a sulfate.

In one embodiment, the electroplating process may comprise a temperature below about 100 degrees, a pH between about 3 and about 11, and a current density above about 10 milli-amperes per centimeter squared.

In one embodiment, the barrier layer 102 as formed may comprise a thickness of between about 500 angstroms and about 7 microns. In one embodiment, the barrier layer 102 as formed may comprise a molybdenum percentage between about 5 percent and about 80 percent. The barrier layer 102 may further comprises a material selected from the group consisting of nickel, cobalt and iron, in some embodiments. It will be understood by those skilled in the art that the barrier layer 102 may be formed by various other methods utilized to form barrier layers, such as but not limited to physical vapor deposition, for example.

A lead free interconnect structure 104 may be attached and/or formed on the barrier layer 102 to form a joint structure 110 (FIG. 1c). The lead free interconnect structure 104 may comprise an interconnect structure that may be substantially free of lead. The lead free interconnect structure 104 may comprise tin, in one embodiment, but may comprise any such material and/or combinations of materials that may serve to electrically connect microelectronic structures to each other without the use of lead. In one embodiment, the lead free interconnect structure 104 may comprise a lead free solder ball of a controlled, collapsed, chip connection (C4) solder ball array, as are well known in the art.

The barrier layer 102 may serve to substantially prevent the formation of deleterious intermetallic structures that may form between the substrate 100 and the lead free interconnect structure 104. Such deleterious intermetallic structures, if formed, may be a cause of failure at the interface between the lead free interconnect structure 104 and the substrate 100. In some cases, such deleterious intermetallics may be points of structural weakness between the lead free interconnect structure 104 and the substrate 100. Thus, by forming the barrier layer 102 between the substrate 100 and the lead free interconnect structure 104, reliability of microelectronic devices utilizing the barrier layer 102 may be greatly enhanced, and manufacturing yield may thereby increase dramatically.

In one embodiment, the joint structure 110 may comprise a barrier layer 102 that may comprise about 40 percent molybdenum. The barrier layer 102 may further comprise about 60 percent of at least one of nickel, cobalt and iron, and/or combinations thereof. The substrate 100 of the joint structure 110 may comprise a copper conductive layer of a package structure, for example. The lead free interconnect structure 104 may comprise a lead free solder ball comprising tin.

When the barrier layer 102 comprises iron, the joint structure 110 may be substantially free of iron oxide (i.e. rust), due to the barrier layer 102 comprising molybdenum, which substantially prevents the formation of iron oxide between the copper substrate 100 and the lead free interconnect structure 104, in the present embodiment. In general, the molybdenum of the barrier layer 102 may substantially prevent the formation of oxide and or other such film/intermetallic formation and/or chemical/physical reactions between the barrier layer 102 and the substrate 100, thus improving the reliability of the joint structure 110.

Figure 2:
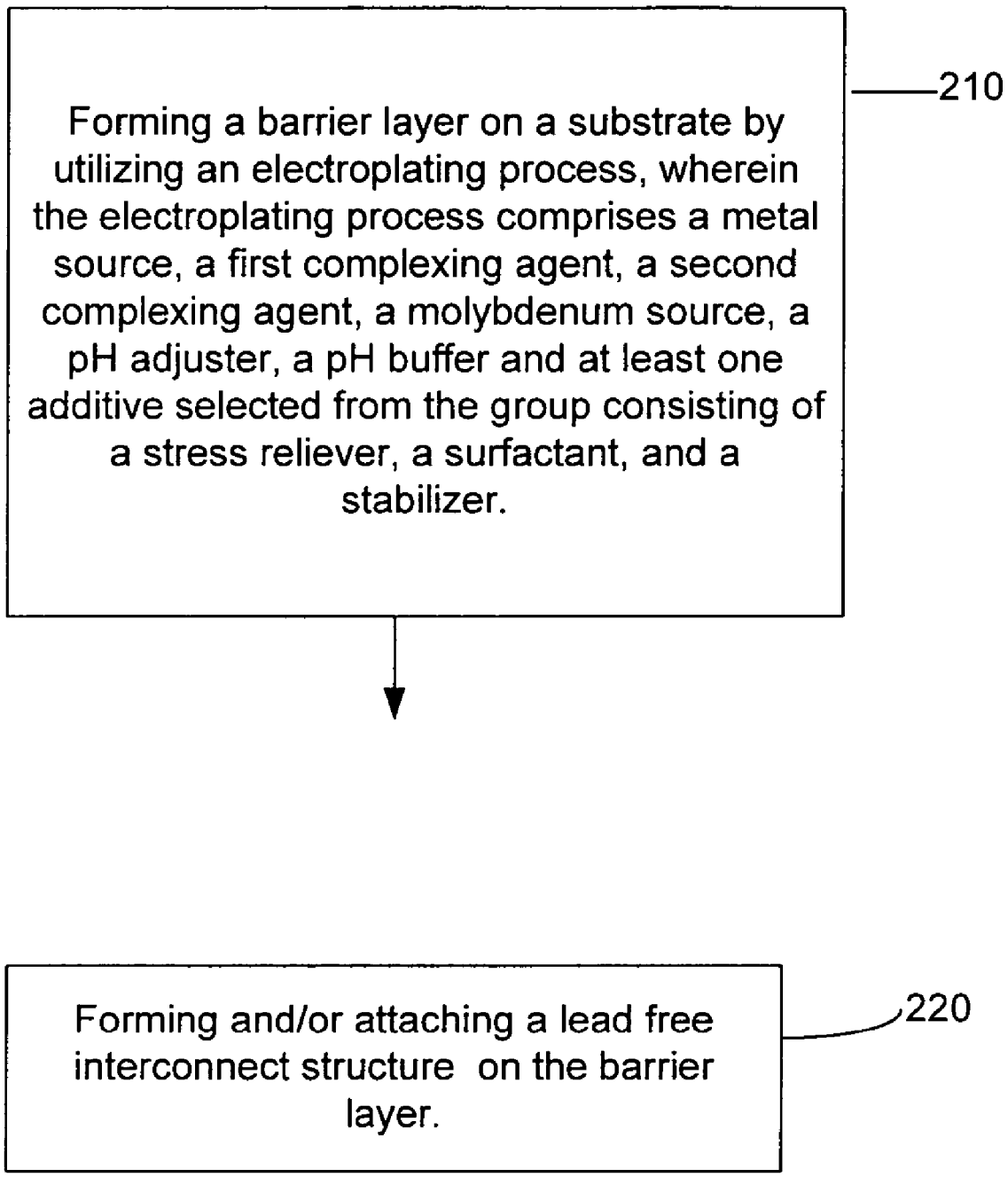
FIG. 2 represents a flow chart according to an embodiment of the present invention.

FIG. 2 depicts a flowchart of an embodiment of the present invention. At step 210, a barrier layer may be formed on a substrate by utilizing an electroplating process, wherein the electroplating process comprises a metal source, a first complexing agent, a second complexing agent, a molybdenum source, a pH adjuster, a pH buffer and at least one additive selected from the group consisting of a stress reliever, a surfactant, and a stabilizer.

In one embodiment, the metal source may comprise at least one of iron, nickel and cobalt, and the substrate may comprise a copper interconnect layer of a package structure, such as a ball grid array package, for example. At step 220, a lead free interconnect structure may be formed and/or attached on the barrier layer. In one embodiment, the lead free interconnect structure may comprise tin.

Figure 3A:
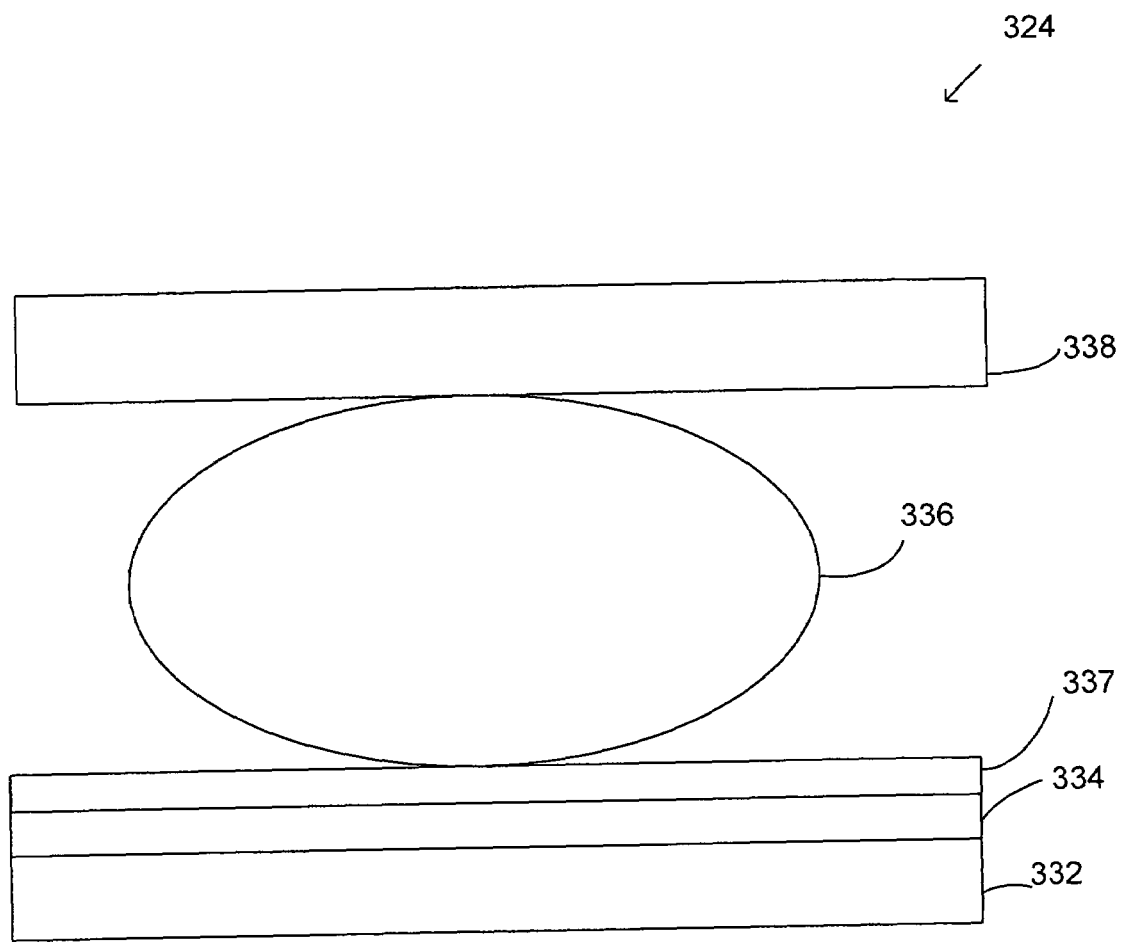
FIGS. 3a-3b represent a system according to an embodiment of the present invention.

FIG. 3a depicts a joint structure 324, similar to the joint structure 110 of FIG. 1c, for example. In one embodiment, the joint structure 324 may comprise a substrate 332, that in one embodiment may comprise a conductive layer of a package structure, a barrier layer 334 (similar to the barrier layer 102 of FIG. 1c, for example), and a lead free interconnect structure 336 (similar to the lead free interconnect structure 104 of FIG. 1c, for example). In some embodiments, a wetting layer 337, such as but not limited to nickel, for example, may be disposed between the barrier layer 334 and the lead free interconnect structure 336. The wetting layer 337 may serve to provide and/or improve adhesion between the barrier layer 334 and the lead free interconnect structure 336, but it will be understood that the wetting layer 337 may not be necessary in some embodiments. The substrate 332 may further comprise a package structure (not shown), such as a ball grid array package, for example, that may be coupled with a motherboard, such as a printed circuit board (PCB) (not shown) for example.

Figure 3B:
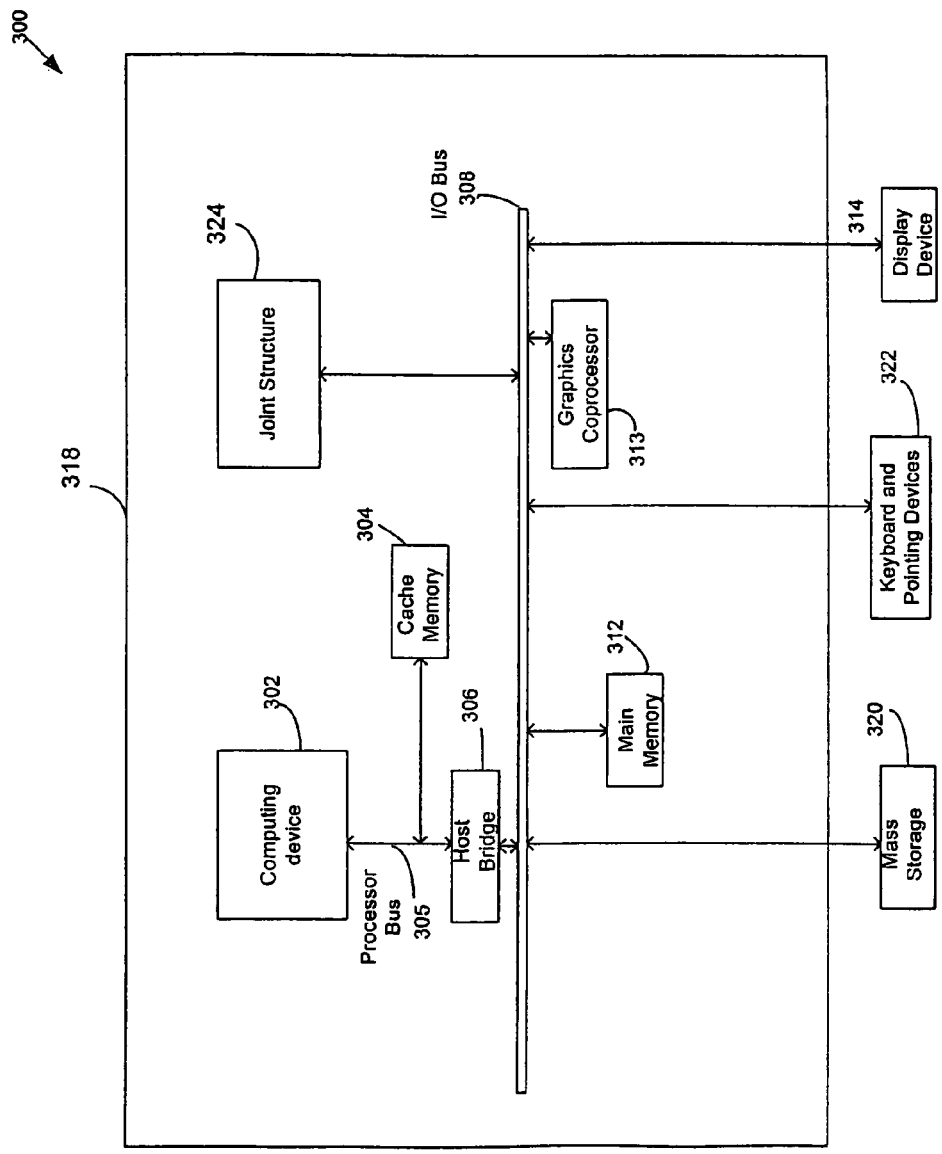

FIG. 3b is a diagram illustrating an exemplary system 300 that is capable of being operated with methods for fabricating a microelectronic structure, such as the joint structure 324 of FIG. 3a, for example. It will be understood that the present embodiment is but one of many possible systems in which the joint structures of the present invention may be used.

In the system 300, the joint structure 324 may be communicatively coupled to a printed circuit board (PCB) 318 by way of an I/O bus 308. The communicative coupling of the joint structure 324 may be established by physical means, such as through the use of a package and/or a socket connection to mount the joint structure 324 to the PCB 318 (for example by the use of a chip package, interposer and/or a land grid array socket). The joint structure 324 may also be communicatively coupled to the PCB 318 through various wireless means (for example, without the use of a physical connection to the PCB), as are well known in the art.

The system 300 may include a computing device 302, such as a processor, and a cache memory 304 communicatively coupled to each other through a processor bus 305. The processor bus 305 and the I/O bus 308 may be bridged by a host bridge 306. Communicatively coupled to the I/O bus 308 and also to the joint structure 324 may be a main memory 312. Examples of the main memory 312 may include, but are not limited to, static random access memory (SRAM) and/or dynamic random access memory (DRAM), and/or some other state preserving mediums. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322.

These elements perform their conventional functions well known in the art. In particular, mass storage 320 may be used to provide long-term storage for the executable instructions for a method for forming joint structures in accordance with embodiments of the present invention, whereas main memory 312 may be used to store on a shorter term basis the executable instructions of a method for a forming joint structures in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as a joint structure, are well known in the art. Therefore, the Figures provided herein illustrate only portions of an exemplary microelectronic structure that pertains to the practice of the present invention. Thus the present invention is not limited to the structures described herein.

What is claimed is:

1. A method of forming a structure comprising:

forming a barrier layer by utilizing an electroplating process on a substrate, wherein the electroplating process comprises an aqueous solution comprising a metal source, a first complexing agent, a second complexing agent, a molybdenum source, a pH adjuster, a pH buffer and at least one additive selected from the group consisting of a stress reliever, a surfactant, and a stabilizer, and wherein the baffler layer comprises molybdenum, and wherein the electroplating process comprises a cathode comprising at least one of copper, bronze and brass; and forming a lead free interconnect structure on the barrier layer.

2. The method of claim 1 wherein the barrier layer further comprises a material selected from the group consisting of nickel, cobalt and iron.

3. The method of claim 1 wherein the metal source comprises at least one of iron, nickel and cobalt.

4. The method of claim 1 wherein the metal source comprises at least one of a chloride salt, a sulfate salt, a sulfamate salt, and an acetate salt.

5. The method of claim 1 wherein the first complexing agent comprises at least one of citric acid, citrate, pyrophosphate and acetate and combinations thereof.

6. The method of claim 1 wherein the second complexing agent comprises at least one of tartrate, glycolic acid, acetate, acetic acid, and ammonium chloride.

7. The method of claim 1 wherein the molybdenum source comprises at least one of potassium molybdate, sodium molybdate and ammonium molybdate.

8. The method of claim 1 wherein the electroplating process comprises an anode selected from the group consisting of iron, cobalt, and nickel.

9. The method of claim 1 wherein the electroplating process comprises a temperature below about 100 degrees, a pH between about 3 and about 11, and a current density above about 10 milli-amperes per centimeter squared.

10. The method of claim 1 wherein the barrier layer comprises a thickness of between about 500 angstroms and about 7 microns.

11. The method of claim 1 wherein the barrier layer comprises a molybdenum percentage of between about 5 percent and about 80 percent.

12. The method of claim 1 wherein forming the lead free interconnect structure on the baffler layer comprises forming a wetting layer on the baffler layer, and then forming the lead free interconnect structure on the wetting layer.

* * * * *